United States Patent [19]

Onitsuka

[11] Patent Number: 5,591,295
[45] Date of Patent: Jan. 7, 1997

[54] BONDING APPARATUS FOR ELECTRONIC COMPONENTS

[75] Inventor: Yasuto Onitsuka, Fukuoka, Japan

[73] Assignee: Matsushita Electric Industrial Co., Ltd., Osaka, Japan

[21] Appl. No.: 338,413

[22] Filed: Nov. 14, 1994

[30] Foreign Application Priority Data

Nov. 16, 1993 [JP] Japan .................................. 5-286576

[51] Int. Cl.⁶ ..................................... B32B 31/00
[52] U.S. Cl. ..................... 156/363; 156/556; 156/557; 156/567; 156/571
[58] Field of Search ..................... 156/362, 363, 156/364, 556, 557, 567, 569, 571

[56] References Cited

U.S. PATENT DOCUMENTS

| | | | |
|---|---|---|---|
| 4,372,802 | 2/1983 | Harigane et al. | 156/556 X |
| 4,526,646 | 7/1985 | Suzuki et al. | 156/363 X |
| 4,919,746 | 4/1990 | Celia | 156/359 |
| 4,931,128 | 6/1990 | Hamano | 156/362 |
| 4,980,002 | 12/1990 | Dzarnoski et al. | 156/556 X |
| 5,250,144 | 10/1993 | Fitzpatrick et al. | 156/556 |
| 5,338,381 | 8/1994 | Hidese | 156/363 X |

FOREIGN PATENT DOCUMENTS

| | | | |
|---|---|---|---|
| 155530 | 7/1987 | Japan | 156/363 |
| 109728 | 4/1989 | Japan | 156/362 |
| 2150098 | 6/1985 | United Kingdom | 156/557 |

Primary Examiner—David A. Simmons
Assistant Examiner—Paul M. Rivard
Attorney, Agent, or Firm—Ratner & Prestia

[57] ABSTRACT

An apparatus for bonding electronic components on a substrate with high precision and at high speed includes a table device for positioning the substrate to a bonding position, a transfer head that receives the electronic component, a rotating body with a plurality of transfer heads that rotates the transfer head to the bonding position, a recognition device that senses a deviation in position between the substrate and the electronic component which has been transferred by the transfer head to the bonding position and a driving mechanism which, according to the deviation in position sensed by the recognition device, finely displaces a lever installed on the transfer head in order to finely rotate the electronic component.

5 Claims, 11 Drawing Sheets

BONDING APPARATUS FOR ELECTRONIC COMPONENTS

FIELD OF THE INVENTION

The present invention relates to an apparatus for bonding electronic components on a substrate.

BACKGROUND OF THE INVENTION

Liquid crystal panels used as displays for laptop personal computers and other electronic equipment have been fabricated by bonding leads of electronic components on the peripheral portion of the liquid crystal panels.

The electronic components are packaged in a tape carrier package (hereafter referred to as TCP) by using the tape automated bonding method (TAB method), and are obtained by stamping out from a TAB tape with a metal mold.

Electrodes of the liquid crystal panel and leads of the electronic components are both numerous and as small as 100 μm in pitch so that recognition and positioning of both the electrodes and the leads has to be conducted with high precision.

Since many electronic components have to be bonded on to one liquid crystal panel, high speed bonding is preferable.

Automatic bonding apparatus for bonding electronic components to a liquid crystal panel are described in Japanese Patent Provisional Publication No. 186652/1990, Provisional Publication No. 294047/1990, and Provisional Publication No. 123803/1991 (incorporated herein by reference).

In the bonding apparatus set forth in these Provisional Publications, an electronic component which has been recognized at a tentative recognition stage is conveyed by means of a mounting head to a liquid crystal panel placed on a substrate recognition stage, where recognition of the relative position between electrodes of the liquid crystal panel and leads of the electronic component is carried out and thereafter the bonding of both is accomplished.

In the conventional bonding apparatus for electronic components as described above, bonding is conducted by means of one mounting head. For this reason, productivity is low and high-speed bonding is difficult.

SUMMARY OF THE INVENTION

The present invention is embodied in an apparatus for bonding electronic components on a substrate with high precision and at high speed. In one exemplary embodiment of the invention, the apparatus for bonding electronic components on a substrate includes a table device that positions a substrate for bonding; a rotating body that has a plurality of transfer heads equipped with a nozzle shaft having at its lower end a nozzle which is used for receiving an electronic component, and which advances the transfer heads one by one to the bonding position; a recognition device that senses a deviation in position between the substrate and the electronic component; and a rotating mechanism that finely rotates the nozzle shaft and the electronic component.

DETAILED DESCRIPTION

The present invention has the ability to bond electronic components on a substrate with high precision and at high speed. The use of a plurality of transfer heads enables high-speed bonding. A driving mechanism, wherein a lever mounted on each transfer head is finely displaced to finely rotate a nozzle shaft, enables high-precision positioning of the electronic component. Since the driving mechanism is designed such that only a lever of a transfer head which stops at the bonding position is finely displaced, it is not necessary to provide each transfer head with a driving mechanism, thus allowing for a smaller turn table device.

Figure 1:
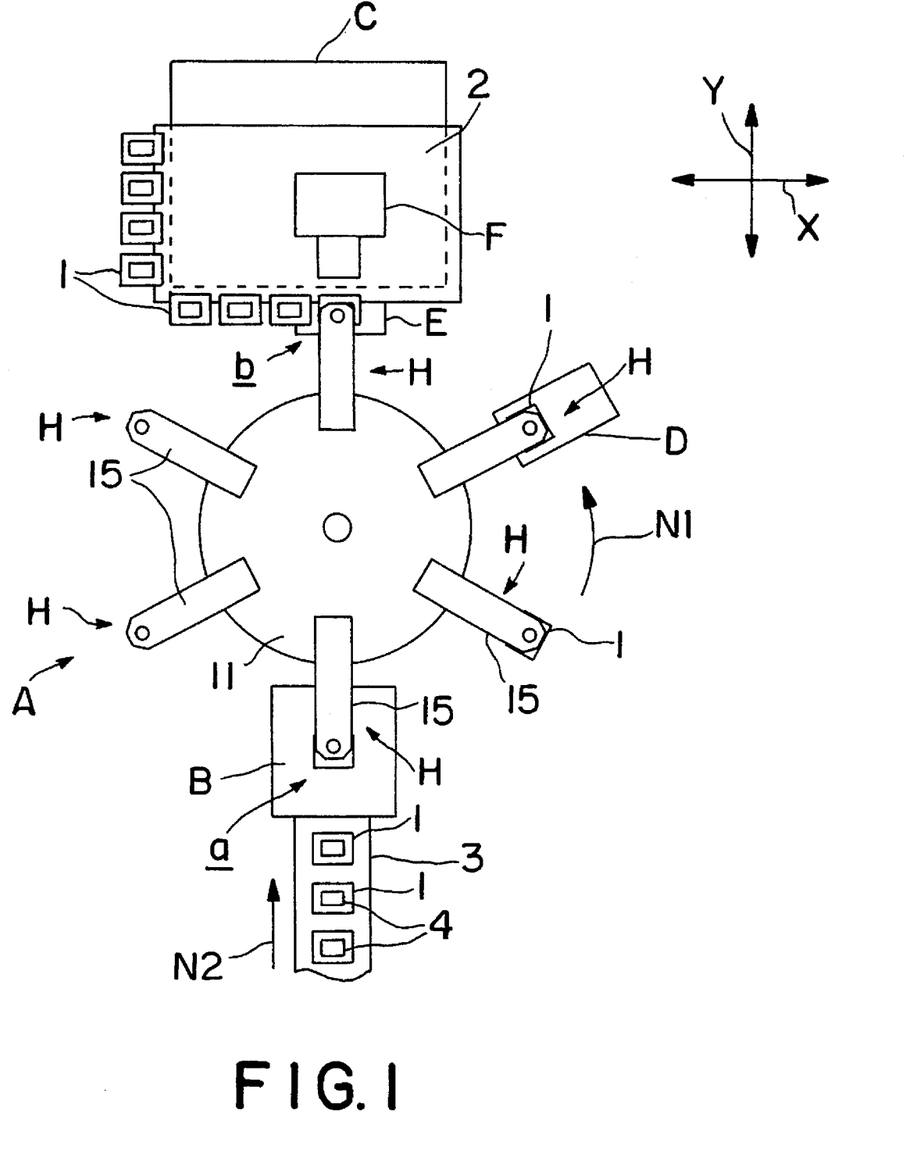
FIG. 1 is a plane view in accordance with an exemplary embodiment of the present invention of an apparatus for bonding electronic components on a substrate.

FIG. 1 is a plane view of an exemplary embodiment of the present invention. As shown in FIG. 1, the bonding apparatus comprises a turn table device A, a supply part B for providing and sending an electronic component 1, a table device C for registering a liquid crystal panel to a bonding position, a tentative recognition device D installed on the transfer path of an electronic component, a main recognition device E installed under the bonding position b of an electronic component 1, and a compression bonding head F installed above the table device C.

A turn table device A has several transfer heads H (e.g. 6) installed on a rotating body 11. The transfer head H receives an electronic component 1 at the supply part B. The turn table device rotates the transfer head in the direction of arrow N1, thereby transferring an electronic component 1 to above a liquid crystal panel 2 placed on the table device C.

The supply part B for providing electronic components is a metal mold. Chips 4 are bonded on a film carrier 3 at a fixed pitch. Each electronic component 1 is stamped out with the metal mold from the film carrier 3 advanced in the direction of arrow N2.

It should be noted that a tray containing electronic components stamped out beforehand can also serve as a supply part for providing electronic components.

The table device C serves to position a liquid crystal panel to a bonding position b.

A tentative recognition device D serves to recognize from underneath a position of leads of an electronic component 1 which is being transferred by means of the turn table device A toward a liquid crystal panel 2. For the tentative recognition device D, a camera or a laser device can be employed.

A main recognition device E is installed at a position where leads of an electronic component 1 are bonded to electrodes 5 of a liquid crystal panel 2, and recognizes with high precision a deviation in relative position between the leads of the electronic component 1 and the electrodes 5 of the liquid crystal panel 2 in the X direction, Y direction and ρ direction (horizontally rotating direction). For the main recognition device E, a camera may be employed.

A compression bonding head F serves to thermo-compression bond leads of an electronic component 1 to electrodes of a liquid crystal panel 2.

Figure 2:
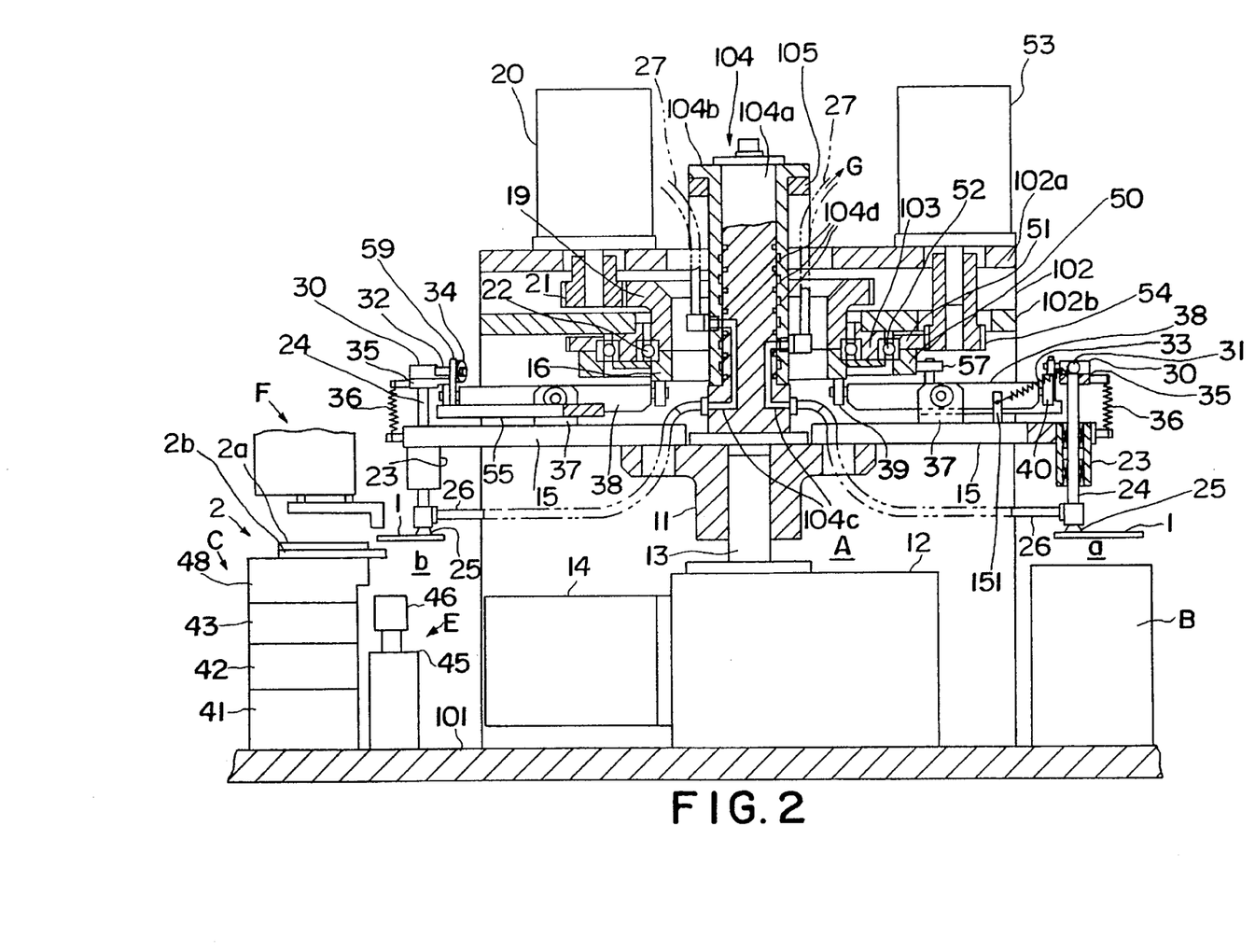
FIG. 2 is a cross sectional drawing in accordance with an exemplary embodiment of the present invention of an apparatus for bonding electronic components on a substrate.

FIG. 2 is a cross sectional drawing of an exemplary embodiment of the present invention. The table device C comprises a holder 48 that receives and holds a liquid crystal panel 2. The holder is on top of tables which control the holder's position in a X direction, a Y direction, and a ρ direction. A X table 41 controls the X direction. A Y table 42 controls the Y direction. A ρ table 43 controls the ρ direction.

The liquid crystal panel 2 consists of an upper plate 2a and a lower plate 2b adhered together, there being formed electrodes 5 ( refer to FIG. 3 ) on an end the lower plate 2b. The upper plate and the lower plate are transparent and the electrodes 5 on the lower plate 2b can be seen from underneath.

Though not illustrated, heterogeneous adhesive tapes are pasted on the upper surface of the electrodes 5 or the lower surface of the leads 6 of the electronic component 1 in order to bond the leads 6 to the electrodes 5.

In FIG. 2, the compression bonding head F is provided with a thermo-compression bonding element 44. The compression bonding head F has an up and down motion mechanism for moving the thermo-compression bonding element 44, thereby lowering the thermo-compression bonding element 44 for thermo-compression bonding of the leads 6 of an electronic component 1 onto the electrodes 5 of a liquid crystal panel 2.

The main recognition device E is under the bonding position b and has A camera 45 having a mirror sleeve 46. The camera 45 recognizes a deviation in relative position between the leads 6 of the electronic component 1 and the electrodes 5 of the liquid crystal panel 2.

Figure 3:
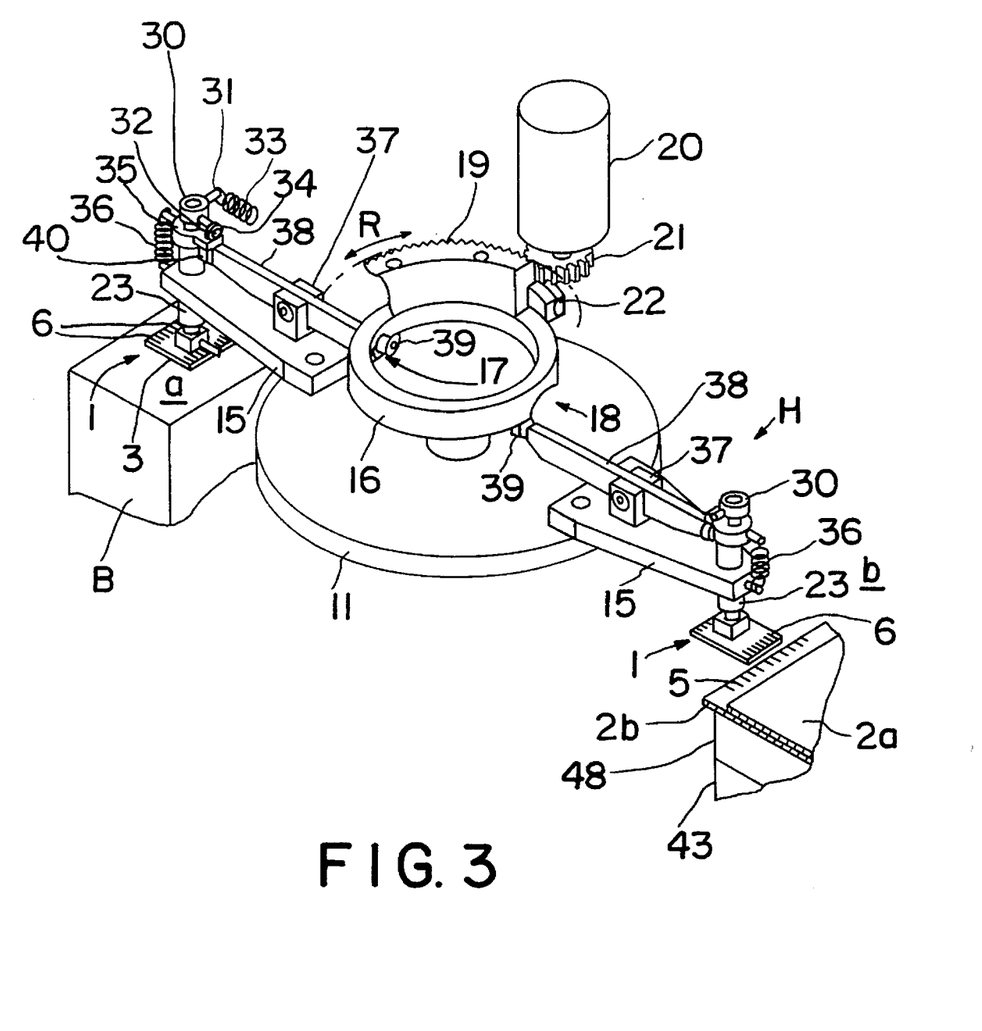
FIG. 3 is a perspective view for illustrating an up and down mechanism of a nozzle shaft in accordance with an exemplary embodiment of the present invention of an apparatus for bonding electronic components on a substrate.
Figure 6:
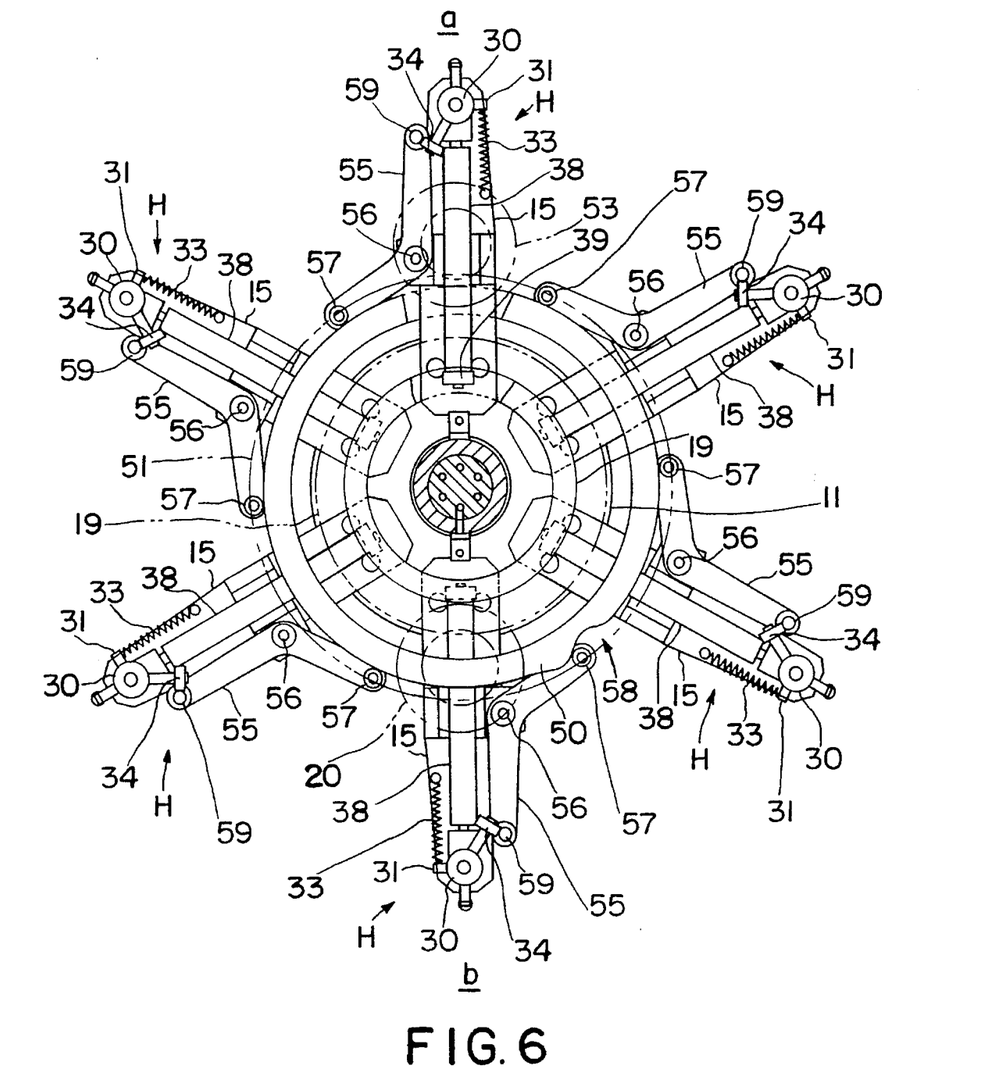
FIG. 6 is a plane cross sectional drawing of part of an apparatus for bonding electronic components on a substrate in accordance with an exemplary embodiment of the present invention.

Referring to FIG. 2, FIG. 3 and FIG. 6, a detailed structure of the turn table device A will be explained.

A third motor 14 is on a base plate 101. An advancing mechanism 12 is driven by the third motor. A rotating body 11 is supported by a first rotating shaft 13 of the advancing mechanism 12. When the third motor 14 is put into motion to drive the advancing mechanism 12, the rotating body 11 rotates. (Refer to arrow N1 of FIG. 1).

Several transfer heads H (e.g. 6) are radially aligned on the rotating body 11. One unit of the transfer head H comprises an arm 15 that is fastened to the rotating body 11, a nozzle shaft 24, a first lever 38, and a second lever 55.

In FIG. 2, a supporting frame 102 is on base plate 101. The upper portion of the supporting frame 102 consists of a two layer structure of a first horizontal part 102a and a second horizontal part 102b.

On an upper surface of the first horizontal part 102a, a first motor 53 and a second motor 20 are mounted, and to a lower surface of the second horizontal part 102b, a first ring shaped bracket 103 is attached.

A first bearing 22 is fastened to an inner circumference of the first ring shaped bracket 103. The first bearing 22 guides the rotation of a first ring cam 16. A second bearing 52 is fastened to an outer circumference of the first ring shaped bracket. The second bearing 52 guides the rotation of a second ring cam 50.

A rotating axis of the first ring cam 16 and a rotating axis of the second ring cam 50 coincides with the rotating body 11.

FIG. 3 shows an up and down motion mechanism of a nozzle shaft. For convenience purposes, only two transfer heads H at a pick-up position a and a bonding position b are illustrated.

The first ring cam 16 has a cam surface on its under side, and therein has concave holes 17 and 18 at positions corresponding to the bonding position a and the pick-up position b, respectively.

The first ring cam 16 and a ring shaped first gear 19 bore above the first ring cam form a monoblock structure. A second gear 21 driven by the second motor 20 is engaged with the ring shaped first gear 19. The first bearing 22 guides the rotation of the ring shaped first gear 19.

When the second motor 20 is put into motion, the second gear 21 rotates. The rotation of the second gear will rotate the ring shaped first gear 19 and the first ring cam 16 in the direction of arrow R.

In FIG. 2 and FIG. 3, a nozzle holder 23 is attached to the pointed portion of the arm 15. A nozzle shaft 23 is inserted inside the nozzle holder. The nozzle shaft 23 moves freely up and down, and rotates freely around its center axis. A nozzle 25 is fastened to a lower portion of the nozzle shaft 24. The nozzle 25 vacuum receives an electronic component 1. An upper portion of the nozzle shaft, which forms a large-diameter part 30, secures radially and horizontally a first pin 31 and a second pin 32.

The first pin 31 is pulled by a coil spring 33. A third roller 34 is secured to the second pin 32. An opposite end of the coil spring 33 is connected to a third pin 151. The third pin is secured to the arm 15. Beneath the large-diameter part 30 is a stopper 35 that freely slides against the nozzle shaft 24. The stopper 35 and the arm 15 are coupled by a coil spring 36, which exerts the stopper 35 downward.

A third bearing 37 is secured to a central part of the arm 15. A first lever 38 is pivoted at the third bearing 37, and swings freely up and down.

A first roller 39 is secured to an edge of the first lever 38. The first roller follows the cam surface of the first ring cam 16. A second roller 40 is secured to an opposite edge of the first lever 38. The second roller is in contact with a stopper 35. The stopper 35 is in contact with the second roller 40 by spring force of the second coil spring 36.

When the second motor 20 is put into motion, the first ring cam 16 rotates and the first roller 39 rolls and moves according to the concave portions 17 and 18 of the cam surface.

When the first roller 39 comes into the concave portion 17 or 18, the first lever 38 swings in such a way that the edge of the first lever is lowered by the stopper 35 exerted by the force of the second coil spring 36. The nozzle shaft 24 subsequently goes down by the vertical component of force of the coil spring 33.

When the first roller 39 goes out from the concave portion 17 or 18, the first roller 39 is forced to go down by the cam surface, and the nozzle shaft 24 goes up overcoming the force of the second coil spring 36.

Thus, the first ring cam 16, the second motor 29, the first lever 38, the stopper 33 and the second coil spring 36 provide a means for up and down motion in the nozzle shaft 24.

Referring to FIG. 2, FIG. 4, FIG. 5 and FIG. 6, a fine rotating mechanism for rotating the nozzle shaft around its axis will be explained.

Figure 4:
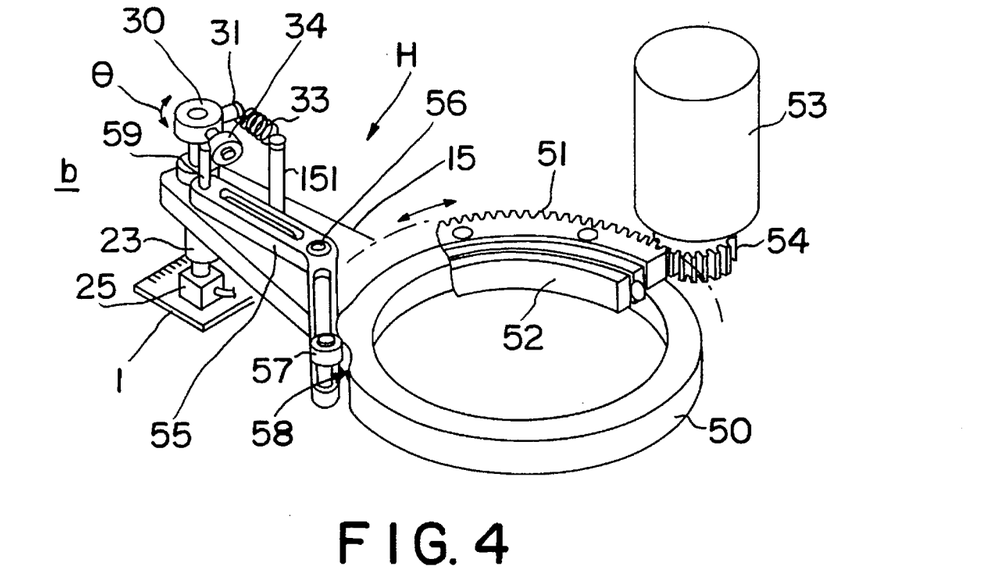
FIG. 4 is a perspective view for illustrating a rotating mechanism of a nozzle shaft in accordance with an exemplary embodiment of the present invention of an apparatus for bonding electronic components on a substrate.

A second ring cam 50 and a third gear 51 form a monoblock structure. A second bearing 52 serves to guide rotation of the second ring cam 50. A forth gear 54 is fastened to the rotating shaft of the first motor 53. The fourth gear 54 is engaged with the third gear 51.

On the arm 15, a second lever 55 is pivoted at a second rotating axis 56. The second lever 55 is crooked and a second roller 57 is secured to a rear edge of the second lever. The second roller 57 follows the cam surface of the second ring cam 50. A forth pin is vertically secured to a front edge portion of the second lever.

The second ring cam 50 has a concave and convex portion 58 in an outer circumferential surface. The position of the concave and convex portion of the second ring cam corresponds to the bonding position b.

By spring force of the first coil spring 33, the second roller 34, serving as a pressing element, pushes the fourth pin 59 to the front edge of the second lever 55.

Thus, the second lever 55 is exerted anti-clockwise (refer to FIG. 5) by spring force of the first coil spring 33. The spring force of the first coil spring pushes the second roller 57 at the rear edge of the second lever 55 along a circumferential surface of the second ring cam 50.

In FIG. 6, as the rotating body 1 rotates intermittently, the fourth roller 57 moves along the circumferential surface of the second ring cam 50. When the transfer head H stops at the bonding position b, the fourth roller 57 of the second lever 55 stops at a middle position of the concave and convex portion 58 formed on the second ring cam 50.

In this state, when the first motor 53 is set in motion and the fourth gear 54 rotates, the second ring cam 50 rotates and the fourth roller 57 moves along the concave and convex portion 58. The second lever 55 then rotates a small amount in the $\rho$ direction around a second rotating axis 56. The rotation of the second lever 55 causes a fine displacement of the fourth pin 59, which is in contact with the third roller 34, thereby finely rotating the nozzle shaft 24 in the $\rho$ direction. The angle of rotation in the $\rho$ direction depends on the amount of rotation of the second ring cam 50.

Figure 5:
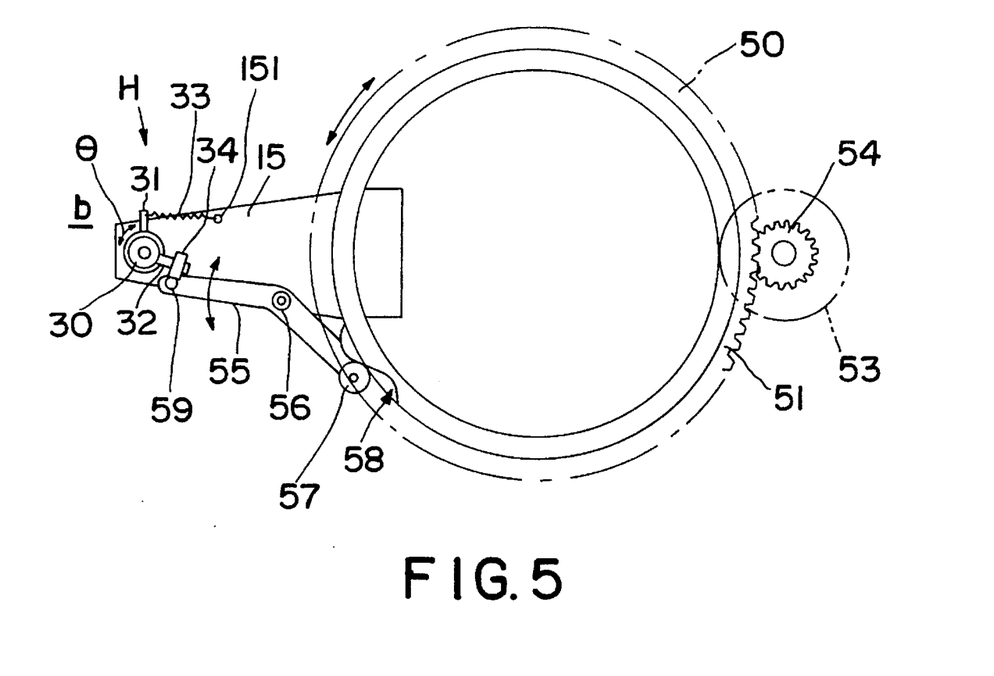
FIG. 5 is a plane drawing for illustrating a rotating mechanism of an apparatus for bonding electronic components on a substrate in accordance with an exemplary embodiment of the present invention.

The second ring cam 50, the first motor 53, the second lever 55, the third roller 34 (pressing element) and the first coil spring 33 (exerting element) provide a means for a rotating mechanism that finely rotates the nozzle shaft 24 in the $\rho$ direction around its axis.

In this exemplary embodiment of the present invention, the second ring cam 50 and the first motor 53 constitute a driving mechanism for finely displacing the second lever 55.

Next, referring to FIG. 2 and FIG. 7, the tubing system will be explained.

In FIG. 2, a first tube 26 is connected to the nozzle 25, and through a rotary valve 104 and a second tube 27 to a receiving apparatus G. The rotary valve 104 has an inner cylinder part 104a that is fixed on the rotating body 11 and an outer cylinder part 104b that freely rotates around the inner cylinder 104a. An upper end of the outer cylinder 104b is fixed by means of a second bracket 105 to the first horizontal part 102a.

A plurality of paths 104c are formed inside of the inner cylinder 104a. Lower ends of the paths 104c are connected to first tubes 26. Upper ends of the paths 104c are connected through ring shaped trenches 104d formed on the inner circumferential surface of the outer cylinder 104b to the receiving apparatus G.

Figure 7:
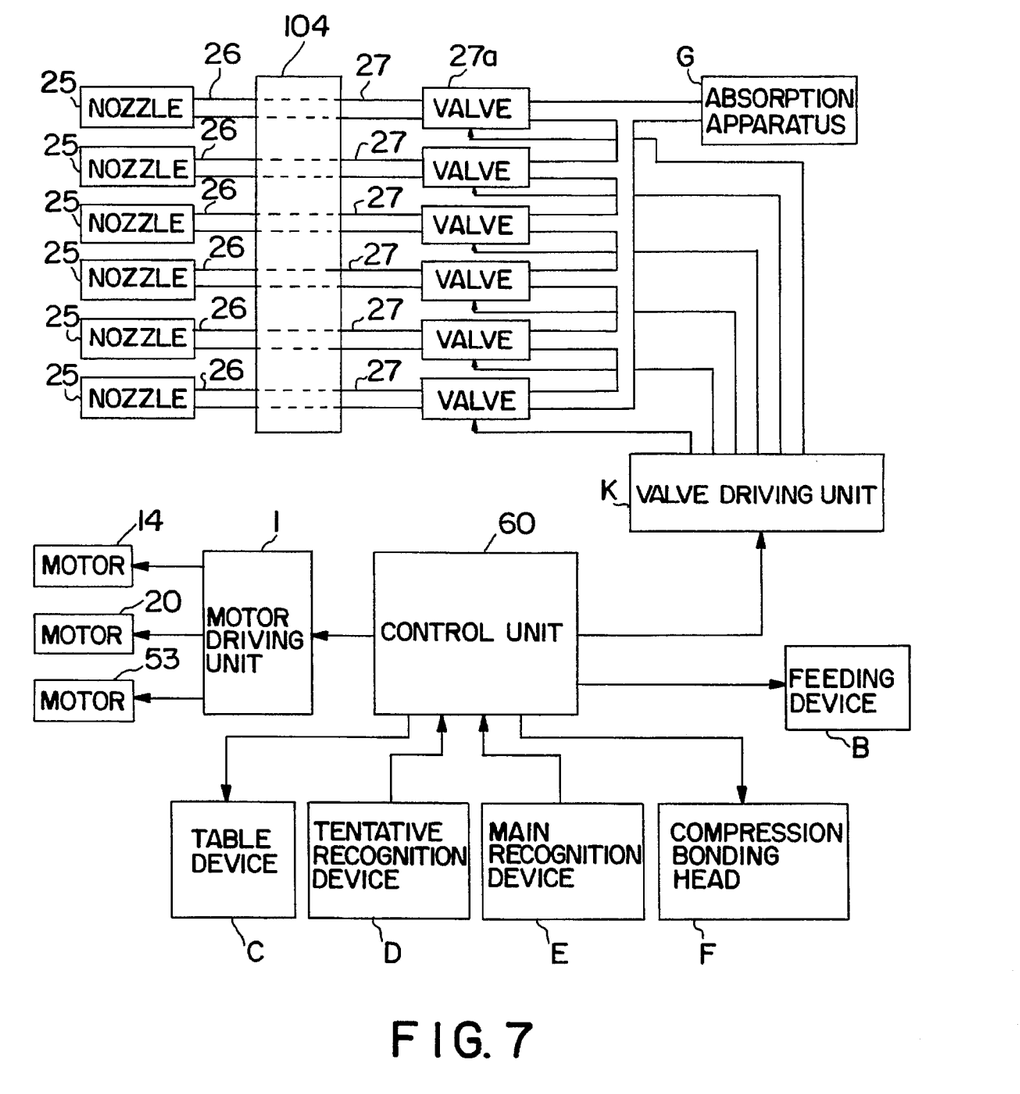
FIG. 7 is a block diagram of a control system for an apparatus for bonding electronic components on a substrate in accordance with an exemplary embodiment of the present invention.

In FIG. 7, each second tube 27 is provided on its way to the receiving apparatus with a valve 27a which controls reception of an electronic component by the nozzle 25.

Next, referring to FIG. 7, the control system will be explained.

The third motor 14, the second motor 20 and the first motor 53 are connected through a motor driving unit I to a control unit 60. These motors are driven by a command from the control unit 60. A valve driving unit K serves to open and shut the valves 27a according to a command from the control unit 60. The control unit 60 is connected to and controls the supply part B, the table device C, the tentative recognition device D, the main recognition device E, and the compression bonding lead F.

The control unit 60 controls the first motor 53 and the table device C in order to position the leads 6 of an electronic component 1 to the electrodes 5 of an liquid crystal panel 2.

Next, the overall operation of the bonding apparatus will be explained.

In FIG. 1 and FIG. 2, as the rotating body 11 rotates in the N1 direction, an electronic component 1 picked up with the nozzle 25 at the pick-up position a is transferred to above the tentative recognition device D and is tentatively recognized. The tentative recognition device D senses whether an electronic component is held by the nozzle 25 and coarsely recognizes the position of the leads 6 of the electronic component I.

As the rotating body 11 further rotates, the electronic component 1 is transferred from the tentative recognition device D to the bonding position b. Based on the coarse position of the leads 6 sensed by the tentative recognition device D, the table device is then operated.

Next, referring to FIG. 8(a), FIG. 8(b), FIG. 8(c), FIG. 9(a), FIG. 9(b), and FIG. 9(c), the bonding operation will be explained.

Figure 8A:
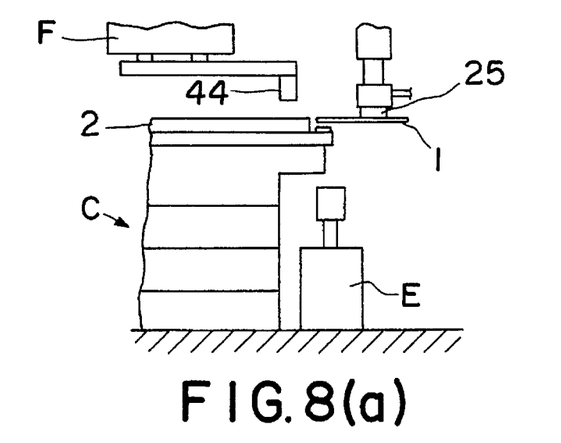
FIGS. 8a, 8b, and 8c are diagrams for illustrating the bonding operation for an apparatus for bonding electronic components on a substrate in accordance with an exemplary embodiment of the present invention.

FIG. 8 shows a state wherein an electronic component 1 received by the nozzle 25 has been transferred to above a liquid crystal panel 2.

Figure 8B:
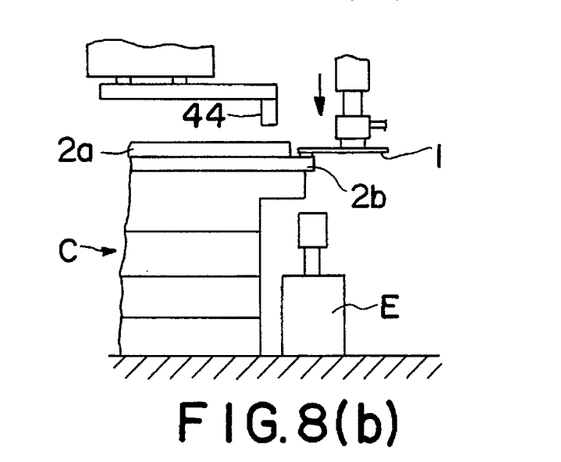

Driven by the second motor 20 (FIG. 3), the nozzle 25 goes down as shown in FIG. 8(b), placing the leads 6 of the electronic component 1 over the electrodes 5 formed on the lower plate 2b of the liquid crystal panel 2. In this state, the deviation in relative position between the leads 6 and the electrodes 5 is sensed by the main recognition device E.

If the deviation is within an allowance, the compression bonding element 44 is lowered to just above the leads 6, and then thermo-compression bonding of the leads 6 to the electrodes 5 is carried out.

Figure 8C:
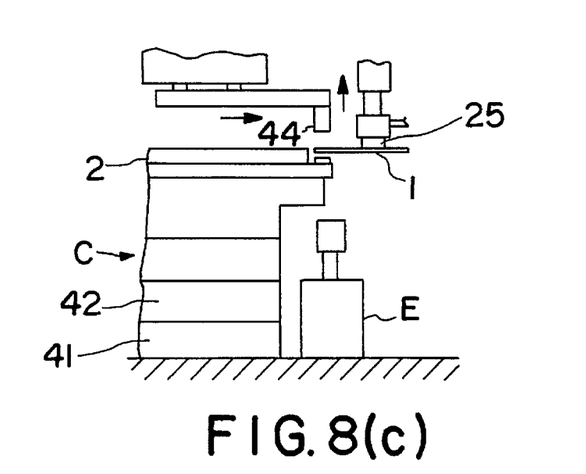

If the deviation is over the allowance, the nozzle 25 goes up as shown in FIG. 8(c), and the electronic component 1 is then removed from the liquid crystal panel 2. Next, by driving the X table 41 and the Y table 42, the deviation in position in the X direction and Y direction is corrected.

In addition, by driving the first motor 53 (FIG. 4), the nozzle shaft 24 is rotated in the ρ direction, and the deviation in position in the ρ direction is thus corrected. The rotating mechanism, as described referring to FIG. 4 and FIG. 5, enables fine rotation of the nozzle shaft and precise correction of deviation in position in the ρ direction. The compression bonding element 44 then starts to down toward the leads 6.

Figure 9A:
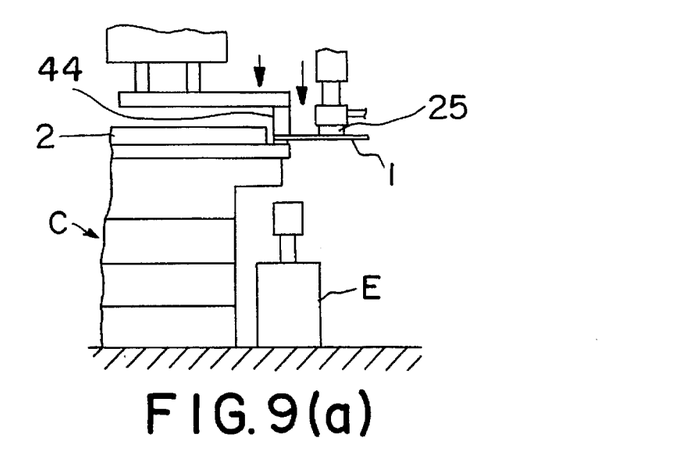
FIGS. 9a, 9b, and 9c are additional diagrams for illustrating the bonding operation for an apparatus for bonding electronic components on a substrate in accordance with an exemplary embodiment of the present invention.

After the deviation in position in the X direction, the Y direction and the ρ direction is corrected, the nozzle 25 goes down as shown in FIG. 9(a), placing the leads 6 of the electronic component 1 in contact with the electrodes 5 of the liquid crystal panel 2. The compression bonding element 44 goes down in order to thermo-compression bond the leads 6 to the electrodes 5.

Figure 9B:
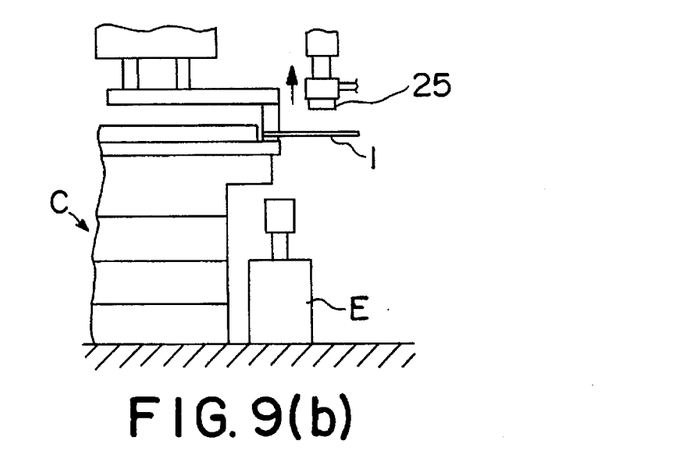
Figure 9C:
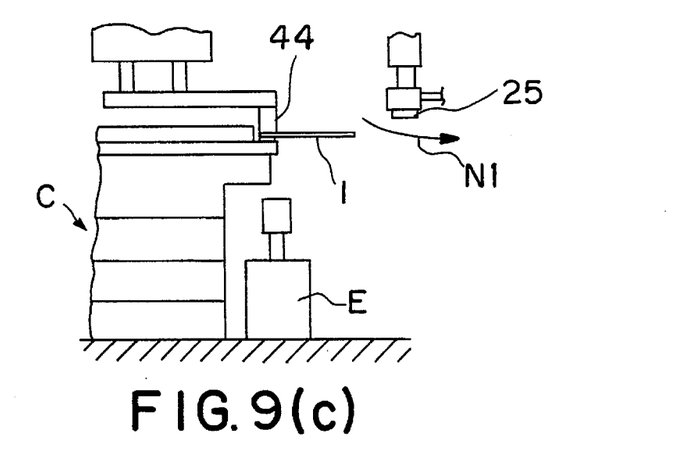

Subsequently, after the electronic component 1 is released, the nozzle 25 goes up as shown in FIG. 9(b). The rotating body 11 rotates in indexed movement in the N1 direction. The compression bonding element 44 goes up and the bonding operation comes to an end.

By repeating the above mentioned operation, electronic components 1 are bonded one by one to the liquid crystal panel 2.

Figure 10:
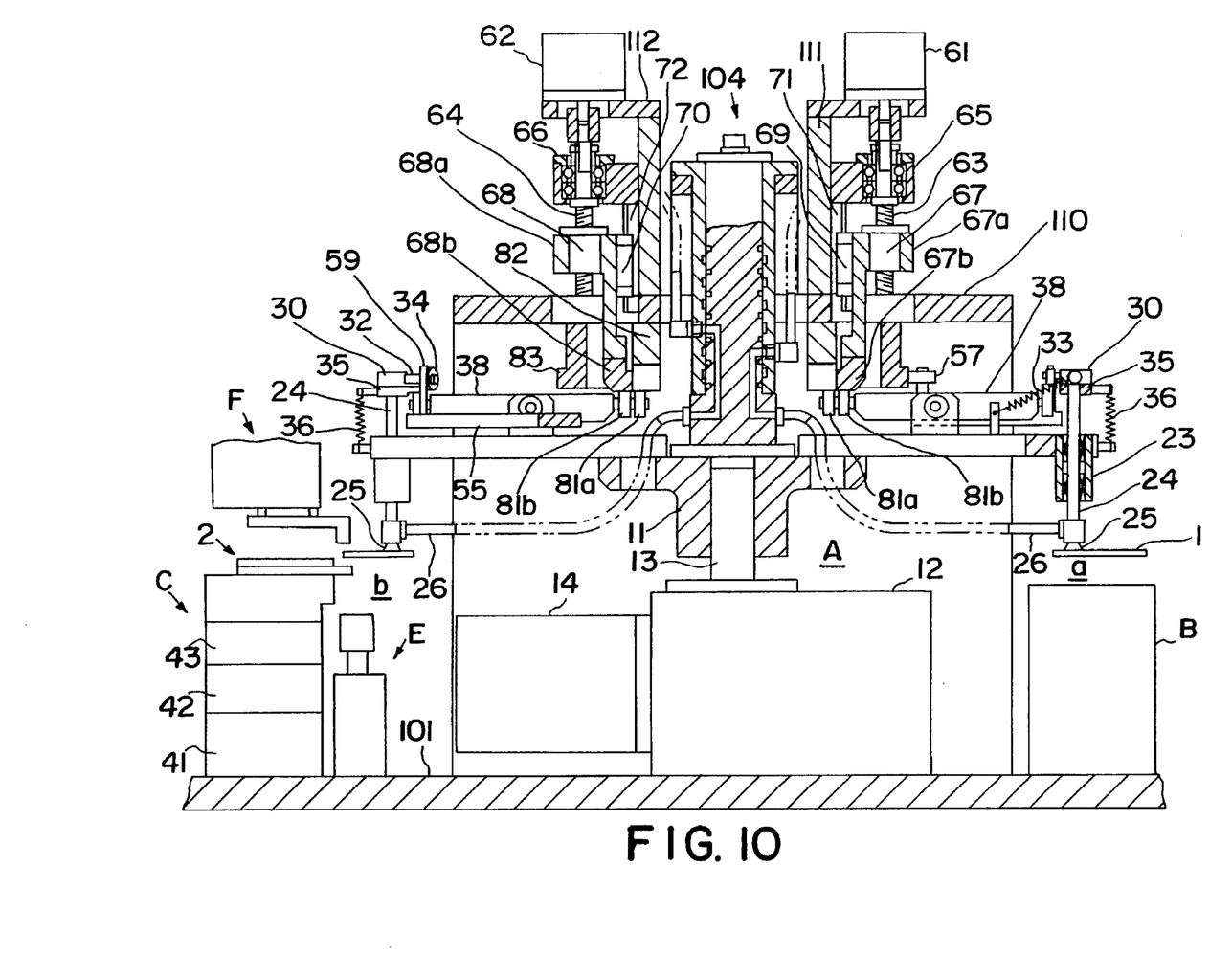
FIG. 10 is a cross sectional drawing of an alternative apparatus for bonding electronic components on a substrate in accordance with an exemplary embodiment of the present invention.
Figure 11:
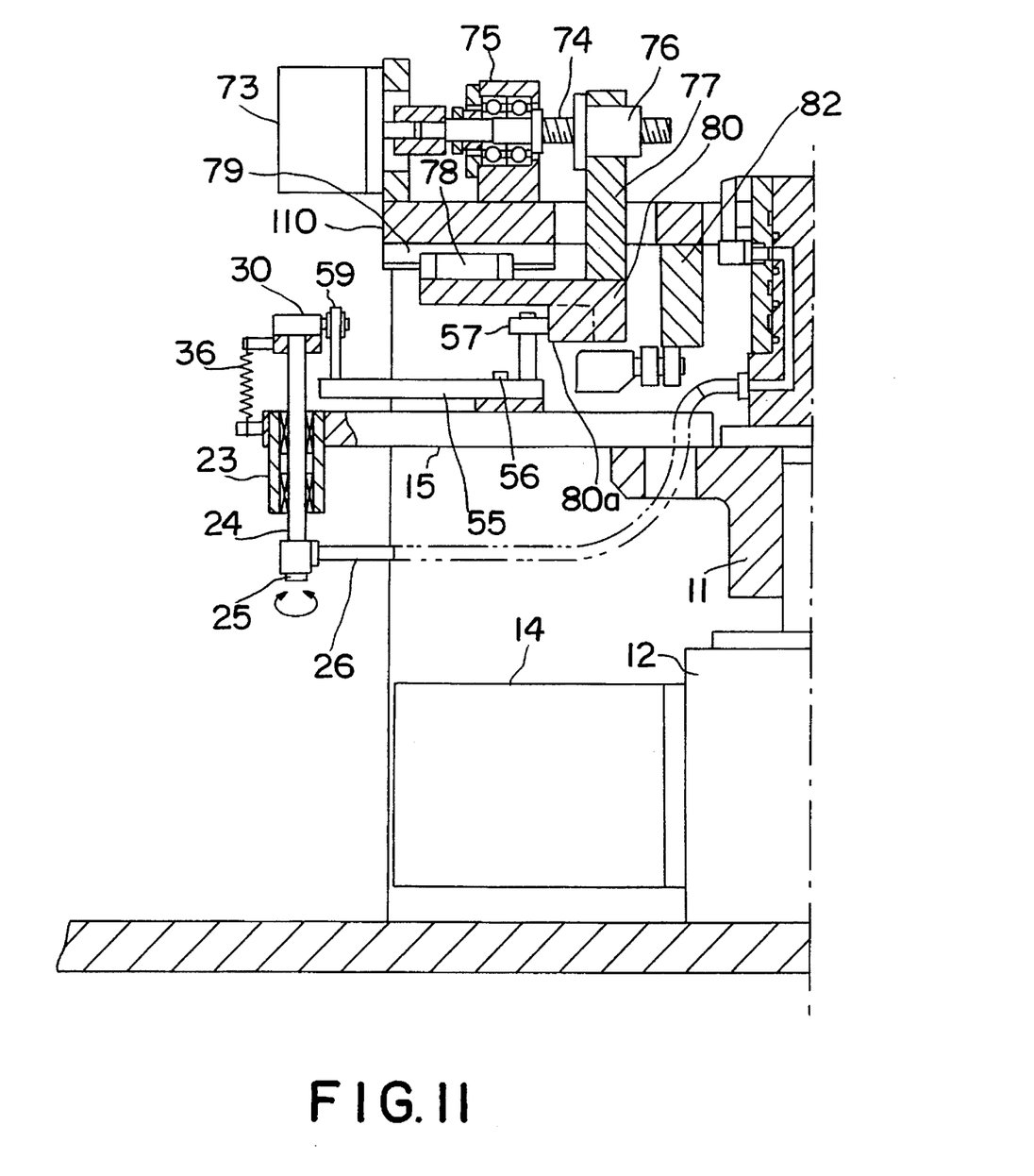
FIG. 11 is an enlarged cross sectional drawing showing the key portion of an alternative apparatus for bonding electronic components on a substrate in accordance with an exemplary embodiment of the present invention.
Figure 12:
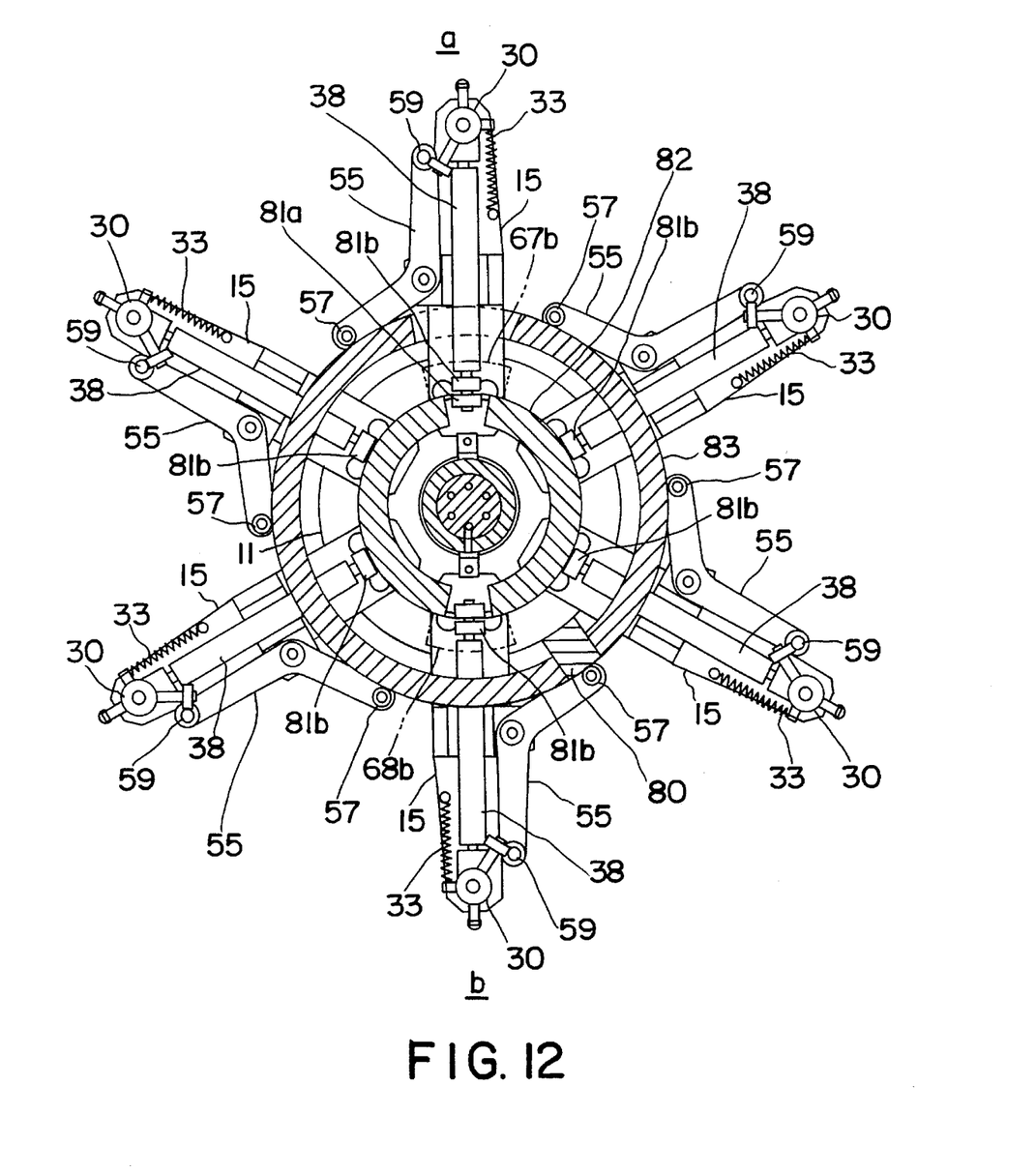
FIG. 12 is a plane cross sectional drawing of part of an alternative apparatus for bonding electronic components on a substrate in accordance with an exemplary embodiment of the present invention.

Referring to FIG. 10 to FIG. 12, an alternative apparatus for bonding electronic components to a substrate will be explained. It should be noted that no comments will be made on the same components as used in the first exemplary embodiment. They are affixed with the same codes.

FIG. 10 is a cross sectional drawing an alternative apparatus for bonding electronic components on a substrate.

A first motor 61 and a second motor 62 are installed in positions corresponding to a pick-up position a and a bonding position b, respectively. A first motor 61 and a second motor 62 are mounted on a supporting frame 110 by means of a first bracket 111 and a second bracket 112, respectively. The first motor rotates a first sending screw 63 and the second motor rotates a second sending screw 64. A fourth bearing 65 and a fifth bearing 66 are fastened to the first bracket 111 and the second bracket 112, respectively. The first sending screw 67 and the second sending screw 64 are coupled with a first nut 67 and a second nut 68, respectively.

The first nut 67 and the second nut 68 are fastened to a first up-and-down part 67a and a second up-and-down part 68a, respectively. A lower portion of the first up-and-down part 67a and the second up-and-down part 68a are fastened to a first block 67b and a second block 68b, respectively.

A first cam 82 is cylindrical, and is fixed to a lower surface of the supporting frame 110. In FIG. 12, the first cam 82 has lacking parts corresponding to the pick-up position a and the bonding position b. The first block 67b and the second block 68b screen the outer sides of the lacking parts 82a.

A first roller 81a and a second roller 81b are fastened to a rear portion of a lever 38. The first roller 81a follows a lower surface of the first cam 82. The second rollers 81b are in contact with the lower surfaces of the first block 67b and the second block 68b, respectively. A first slider 69 and a second slider 70 are fastened to the back sides of the up-and-down part 67a and the up-and-down part 68a, respectively.

The first slider 69 slides on a first guide rail 71 vertically attached to the first bracket 111. The second slider 70 slides on a second guide rail 72 vertically attached to the second bracket 112.

When the first motor 61 and the second motor 62 are set in motion, the first nut 67 and the second nut 68 go up and down along the first sending screw 63 and the second sending screw 64, respectively. The first block 67b and the second block 68b also go up and down.

Subsequently, the first lever 38, pivoted at a third bearing 37, swings up and down, thereby moving the nozzle shaft up and down.

Next, referring to FIG. 10, FIG. 11, and FIG. 12, the rotating mechanism of the nozzle shaft 24 will be explained.

A cylindrical second cam 83 is fixed to the lower surface of the supporting frame 110.

In FIG. 11, a fourth motor 73 rotates a third sending screw 74 held by a sixth bearing 75. The fourth motor 73 and the sixth bearing 75 are mounted on the supporting frame 110. The third sending screw 74 is coupled with a third nut 76. A frame 77 is fastened to the third nut 76. A third block is fastened to a lower portion of the frame 77.

The cylindrical second cam 83 has a lacking part where the third block 80 can freely slide in the radius direction.

A fourth roller 57, secured to an end of a second-lever 55, is in contact with the outer surface of the second cam 83 along an outer surface 80a of the third block 80.

A third slider 78 is secured onto an upper surface of the third block 80. The third slider 78 is coupled with a third guide rail 79.

As the rotating body 11 rotates, the fourth roller 57 moves along the outer surface of the second cam 83. As the rotating body 11 stops at the bonding position b, the fourth roller 57 is in contact with the outer surface 80a of the third block 80.

In this state, when the fourth motor 73 is set in motion to rotate the third sending screw 74, the third nut 76 moves along the sending screw 74 and simultaneously, the third block 80 shifts in the same direction.

The fourth roller 57 is then pushed by the third block 80 and the second lever 55 is pivoted at the second rotating axis. The second lever is horizontally rotated. The rotation of the second lever rotates the nozzle shaft 24 in the ρ direction.

In the alternative embodiment, the fourth motor 73, the third sending screw 74, the third nut 76 and the third block 80 constitute the driving mechanism for finely displacing the lever.

In the alternative embodiment, the driving mechanism for a lever is placed at a position corresponding to the bonding position. The driving mechanism can be placed at a plurality of positions depending upon the object and application.

Although the described embodiments of the present invention transmit a ρ rotation to the nozzle shaft by swinging the second lever 55 pivoted at the rotating axis 56, it is possible that a second lever 55 which is installed in such a way that it slides freely in one direction against the arm 15, and that by means of this driving mechanism the lever is moved back and forth in one direction, a rotation in the ρ direction can be transmitted to the nozzle shaft 24.

What is claimed:

1. An apparatus for bonding electronic components comprising:

(a) means for conveying electronic components;
(b) a table for positioning a substrate at a bonding position;
(c) a turn table between the conveying means and the table, the turn table comprising:
(1) a rotating body;
(2) a plurality of transfer heads placed on an outer portion of the rotating body, each transfer head comprising:
(i) a nozzle shaft moving up and down and rotating,
(ii) a nozzle at a lower end of the nozzle shaft, the nozzle receiving the electronic component,
(d) a rising and falling mechanism connected to the nozzle shaft;
(e) a recognition device that senses a deviation in position between the electronic component and the substrate;
(f) a driving mechanism for correcting the deviation comprising:
(1) a pressing element coupled to the nozzle shaft,
(2) a lever that is connected to the transfer head, the lever having one end in contact with the pressing element, and
(3) an exerting element that applies a force to an opposite end of the lever, wherein, according to the deviation in position sensed by the recognition device, the driving mechanism finely displaces the lever around an axis of the nozzle shaft at the bonding position; and
(g) a compression bonding head that is placed above the table device and presses and bonds leads formed in the electronic components to electrodes formed in the substrate.

2. The apparatus of claim 1, wherein the exerting element comprises:
(a) a cam that is in contact with the opposite end of the lever;
(b) a motor that drives the cam.

3. The apparatus of claim 1, wherein the exerting element comprises:
(a) a sending screw that is rotated by a motor;
(b) a nut that is coupled with the sending screw;
(c) a block that is fastened to the nut, the block being in contact with the opposite end of the lever.

4. An apparatus for bonding electronic components comprising:
(a) means for conveying electronic components;
(b) a table for positioning a substrate at a bonding position;
(c) a turn table between the conveying means and the table, the turn table comprising:
(1) a rotating body;
(2) a plurality of transfer heads placed on an outer portion of the rotating body, each transfer head comprising:
(i) a nozzle shaft moving up and down and rotating,
(ii) a nozzle at a lower end of the nozzle shall, the nozzle receiving the electronic component,
(d) a recognition device that senses a deviation in position between the electronic component and the substrate; and
(e) driving means for rotating the nozzle shaft according to the deviation in position sensed by the recognition device at the bonding position.

5. An apparatus for bonding electronic components comprising:
(a) means for conveying electronic components;
(b) a table for positioning a substrate at a bonding position;
(c) a turn table between the conveying means and the table, the turn table comprising:
(1) a rotating body;
(2) a plurality of transfer heads placed on an outer portion of the rotating body, each transfer head comprising:
(i) a nozzle shaft moving up and down and rotating,
(ii) a nozzle at a lower end of the nozzle shaft, the nozzle receiving the electronic component,
(d) a rising and falling mechanism connected to the nozzle shaft;
(e) a recognition device that senses a deviation in position between the electronic component and the substrate; and
(f) a driving mechanism for correcting the deviation comprising:
(1) a pressing element coupled m the nozzle shaft,
(2) a lever that is connected to the transfer head, the lever having one end in contact with the pressing element, and
(3) an exerting element that applies a force to an opposite end of the lever,
wherein, according to the deviation in position sensed by the recognition device, the driving mechanism finely displaces the lever around an axis of the nozzle shaft at the bonding position.

* * * * *

UNITED STATES PATENT AND TRADE MARK OFFICE
CERTIFICATE OF CORRECTION

PATENT NO. : 5,591,295
DATED : January 7, 1997
INVENTOR(S) : Onitsuka

It is certified that error appears in the above-identified patent and that said Letters Patent is hereby corrected as shown below:

Column 10, line 8, delete the word "shall" and insert therefor --shaft--.

Column 10, line 40, delete "m" and insert therefor --to--.

Signed and Sealed this

Seventeenth Day of June, 1997

*Attest:*

BRUCE LEHMAN

*Attesting Officer*  Commissioner of Patents and Trademarks